United States Patent [19]

McMenamin

[11] 4,436,674

[45] Mar. 13, 1984

[54] VAPOR MASS FLOW CONTROL SYSTEM

[75] Inventor: Joseph C. McMenamin, Oceanside, Calif.

[73] Assignee: J.C. Schumacher Co., Oceanside, Calif.

[21] Appl. No.: 484,198

[22] Filed: Apr. 12, 1983

Related U.S. Application Data

[63] Continuation-in-part of Ser. No. 288,360, Jul. 30, 1981, Pat. No. 4,393,013, which is a continuation of Ser. No. 151,741, May 20, 1980, abandoned.

[51] Int. Cl.³ ............................................. B01F 3/04
[52] U.S. Cl. ............................... 261/64 B; 73/861.04;
137/101.25; 261/64 D; 261/128; 261/130;
261/DIG. 65
[58] Field of Search .................. 261/39 E, 64 B, 64 D,
261/121 R, 128–130, 142, DIG. 65; 215/32;
73/29, 861.04, 861.49; 374/20; 137/88, 90,
101.25; 219/271–275

[56] References Cited

U.S. PATENT DOCUMENTS

| | | | |
|---|---|---|---|
| 3,528,418 | 9/1970 | Grosholz et al. | 261/DIG. 65 |
| 3,583,685 | 6/1971 | Boerger et al. | 261/121 R X |
| 3,618,061 | 11/1971 | Livers | 73/29 |
| 3,650,151 | 3/1972 | Drexel | 261/DIG. 65 |
| 3,823,728 | 7/1974 | Burris | 137/101.25 X |
| 4,051,886 | 10/1977 | Ross | 261/DIG. 65 |
| 4,134,514 | 1/1979 | Schumacher et al. | 215/32 X |
| 4,140,735 | 2/1979 | Schumacher | 261/DIG. 65 |
| 4,220,460 | 9/1980 | Partus | 261/DIG. 65 |
| 4,276,243 | 6/1981 | Partus | 261/DIG. 65 |
| 4,356,834 | 11/1982 | Le May | 73/29 X |

Primary Examiner—Richard L. Chiesa
Attorney, Agent, or Firm—Knobbe, Martens, Olson & Bear

[57] ABSTRACT

In a system for delivering vapor from a container partially filled with liquid to be vaporized by bubbling a carrier gas therethrough, the flow of the vapor is precisely regulated by a controller so as to provide a uniform mass flow rate of vapor. The controller is programmed to receive signals representing the sensing of the total gaseous pressure, temperature and liquid level in the container and to use the signals in a computation according to the following formula:

$$\overset{\circ}{m}{}^* = AF_c(1 + B\Delta T - C\Delta P - DF_c + E\Delta L)$$

wherein
$\overset{\circ}{m}{}^*$ = Approximate vapor mass flow
$F_c$ = Carrier gas mass flow
$\Delta T$ = Temperature variation from nominal $(T-T_o)$
$\Delta P$ = Pressure variation from nominal $= (P-P_o)$
$\Delta L$ = Charge in liquid level $= -\int \overset{\circ}{m}{}^* dt$
A, B and C = Positive constants computed for each chemical and nominal operating conditions; and
D and E = Positive or negative constants computed for each chemical and nominal operating conditions.
A, B and C = Positive constants computed for each chemical and nominal operating conditions;
D and E = Positive or negative constants computed for each chemical and nominal operating conditions.

10 Claims, 2 Drawing Figures

VAPOR MASS FLOW CONTROL SYSTEM

CROSS-REFERENCE TO RELATED APPLICATION

This is a continuation-in-part application of copending application Ser. No. 288,360, filed July 30, 1981, now U.S. Pat. No. 4,393,013, which is a continuation of Ser. No. 151,741 filed May 20, 1980, now abandoned.

BACKGROUND OF THE INVENTION

This invention relates to an improved system for controlling the flow of vaporized liquid transported by a carrier gas from a reservoir of the liquid to a using system. The control system improves the accuracy with which a uniform mass flow of the vapor is delivered to the using system and is particularly useful in the vapor deposition of high purity, liquid source materials such as in the manufacture of semiconductor devices and fiber optic materials.

The fabrication of semiconductor electronic devices, for example, includes many steps which require the transportation of particular atoms or molecules to the surfaces of wafer substrates which are usually maintained at elevated temperatures. In many of the steps, the most common method for accomplishing this is to transport the vapors from a reservoir of liquid chemical by passing a carrier gas stream through the liquid to vaporize the liquid and carry its vapor to a reaction chamber of the using system. Acceptable performance depends upon maintenance of accurate vapor delivery rates and extremely low levels of impurities, particularly metallics.

Typically, a container is partially filled with an ultra-high purity, liquid source material, and a suitable carrier gas stream is bubbled through the liquid to vaporize a portion of the liquid and transport the vapor from the container to the point of use. The previous methods of vapor flow control that have been customarily used for such bubblers are the thermal-conductivity mass flow meter and the temperature controlled vaporizer bubbler; however, neither method has been entirely satisfactory.

The thermal conductivity mass flow meter monitors the vapor flow from a liquid source bubbler by taking the ratio of the thermal-conductivity of the carrier gas and vapor mixture flowing out of the bubbler, to the thermal-conductivity of the carrier gas flowing into the bubbler (see for example U.S. Pat. No. 3,650,151). The main drawback of this method is the introduction of metallic contamination into the vapor stream. The design and construction of the thermal mass flow meter has necessitated the use of metallic parts, usually stainless steel, in the chemical vapor path. Because of the highly corrosive nature of many of the commonly used chemical vapors (especially in the presence of trace levels of moisture contamination) the metallic parts slowly deteriorate and the resulting metallic impurities are carried with the source vapor to the wafers. This leads not only to wafer contamination in the fabrication of semiconductors and low yield of acceptable wafers, but also to drift and failure in the mass flow controller caused by deterioration by the chemical. Thus, this type of apparatus loses its accuracy over a period of time. In addition the meters themselves are costly and must frequently be repaired and replaced. This is particularly so under conditions of high carrier gas flow, such as is encountered in fiber optic applications.

The temperature controlled bubbler method maintains constant vapor mass flow by closely controlling the bubbler temperature and the mass flow rate of the carrier gas stream. Recently introduced improved bubblers, such as those illustrated in U.S. Pat. Nos. 4,134,514 and 4,140,735 eliminate many contamination and deterioration problems by using only high-purity quartz and Teflon parts in contact with the vapors, and by eliminating chemical handling problems. The main drawback to this method has been fluctuations in the vapor mass flow such that the output has not always been sufficiently satisfactory and has required considerable trial and error adjustment of the carrier gas flow rate. As a result of inadequate controls, there is a significant and frequent loss of partially finished goods. Thus, although these devices do not suffer from deterioration caused by the chemicals used, they are not sufficiently accurate. In addition, there have been some reported instances of connections being broken or bubblers exploding because of improperly high pressures of the carrier gas streams. This results in danger to operating personnel because of the corrosive nature of the liquid source material, as well as the possible loss of the expensive work in progress, such as a batch of semiconductor wafers. Accordingly, a need exists for improved flow control of such a bubbler system. The present invention is concerned with such an improvement for a bubbler system of the temperature controlled type.

SUMMARY OF THE INVENTION

In the operation of temperature controlled bubbler systems, it has been assumed that maintaining a reasonably accurate control of the temperature of the liquid source material and monitoring the flow of the carrier gas would provide sufficient consistency of the vapor flow, since the saturation point of the carrier gas varies with temperature. However, close analysis has revealed a number of sources of error.

For example, it had been assumed that there was no need to monitor pressure in the bubbler because the using system is usually at atmospheric pressure and consequently it has been assumed that the total gaseous pressure within the bubbler was substantially atmospheric. However, it has been discovered that simple changes in atmospheric pressure can produce undesirable errors in the vapor mass flow. Further, valves downstream from the bubbler can introduce back pressure variations which increase the bubbler gaseous pressure to above atmospheric pressure. Moreover, the length of the fluid line from the bubbler to the using system introduces variations in back pressure.

It has also been discovered that variation in the size of the opening through which the gas passes in exiting the bubbler can introduce pressure variations that result in error. Typically, a thin glass seal in the bubbler outlet is broken by magnetically raising a small metal ball and dropping it to break the seal, or by other suitable means that does not guarantee an opening of a consistent size. The size of the opening can affect the accuracy of the system, but the present invention accommodates variations in such openings.

It has further been found that certain errors are introduced into the system by temperature fluctuations that are not sufficiently accommodated by the means employed for maintaining the liquid source material at constant temperature. For example, sudden ambient temperature changes such as that caused by opening a nearby oven door can introduce temporary errors that cannot be corrected quickly by a temperature controller. Further, in some uses of the system, such as the fabrication of fiber optics, a relatively large flow of carrier gas is required. It has been found that this higher carrier gas flow rate can introduce significant evaporative cooling which requires ten to fifteen minutes to stabilize the temperature. This of course results in the loss of very expensive bubbler vapor as well as delaying the manufacturing process.

Related to the high carrier gas flow rate considerations, it was commonly thought that an increased flow rate would result in the carrier gas not being saturated as it bubbled through the liquid source material; however, while this is true with extremely high flow rates, analysis has shown that the rates in question do not result in inadequate saturation, but that instead variations are caused by some of the other sources of error referred to above.

It has also previously been assumed that the carrier gas flow rate was directly proportional to the vapor flow rate, for example, that a doubling of carrier gas flow rate produced a doubling of vapor flow rate from the liquid in the bubbler. This has been found to be untrue and the assumption is a significant source of error, up to about 2%, in achieving uniform mass flow rate of vapor. The error is related to splashing effects and temperature gradients within the bubbler dependent upon bubbler geometry.

Further errors caused by splashing in the bubbler have also been discovered which are related to the level of liquid in the bubbler. Splashing causes greater vapor pick-up by the carrier gas. Splashing decreases as the liquid level decreases, causing temperature gradients in the bubbler in which the upper part of the bubbler where the gases mix is cooler than the bottom part of the bubbler where the temperature sensor usually is. The cooler, upper temperatures tend to condense out vapor and result in lower vapor pick-up than expected.

The present invention now provides means for accommodating such previously unsuspected sources of error and refines the accuracy with which a uniform mass flow rate of vapor is supplied to the using system.

The operation of the vapor mass flow controller of the present invention is based on the theory that accurate vapor mass flow from a liquid source bubbler can be obtained, if the temperature and pressure of the bubbler and the carrier gas mass flow are known. In addition to these factors, empirically observed correction factors, dependent upon bubbler geometry, temperature, liquid level, and flow rate must be applied. It should be noted that the change in correction factor due to bubbler geometry is small enough that a negligible change is required from bubbler to bubbler for normal bubbler manufacturing tolerances, such that the correction factor normally only needs be determined for a particular bubbler design. This is important in that it makes the system more useful. The concept is mathematically expressed as follows:

$$\dot{m} = \frac{\alpha F_c \dot{p}}{P - \dot{p}} f_\alpha(F_c, T, L)$$

where
 $\dot{m}$ = Vapor mass flow
 $F_c$ = Carrier gas mass flow
 P = Total bubbler pressure
 $f_\alpha(F_c,T,L)$ = Empirical correction factor
 T = Bubbler temperature
 L = Liquid level in bubbler
 $\dot{p} = \delta_e(\beta - \gamma/T)$ = partial pressure of the chemical vapor; and $\alpha$, $\beta$, $\gamma$ and $\delta$ = constants for each chemical.

By using this formula and properly measuring the relevant parameters, temperature, pressure, level and carrier gas flow, an accurate determination of the vapor mass flow can be obtained. One or more of these parameters may be regulated through a feedback loop to control the vapor mass flow to any desired value within the available range of the parameters.

In accordance with the invention, changes in the variables are combined by an electronic flow controller which provides an output signal for adjusting the valve controlling the carrier gas flow, which provides the fastest adjustment speed. In addition, a signal is provided to a temperature controller for maintaining the bubbler temperature at a desired point. It has been found that, with such a system, the accuracy of the vapor mass flow may be controlled to significantly greater levels than has previously been attainable with chemically inert apparatus, accuracy can be attained with as little as ±0.5% variation over many years performance. Moreover, machine-to-machine uniformity is increased so that the mass flow from two bubblers operating under identical conditions will differ from one another by as little as 1% in vapor mass flow.

In one embodiment of this invention, the accuracy with which a uniform mass flow of vapor is delivered to the using system is improved by sensing the total gaseous pressure (P) in the bubbler and comparing that pressure with a reference pressure ($P_o$) to provide a pressure differential ($\Delta P = P - P_o$). The control means in the invention uses this pressure differential in a computation that, surprisingly, demands an increase in carrier gas flow rate as the differential increases. Thus, for example, if the total gaseous pressure in the bubbler increases with respect to the reference pressure, the controller calls for an increase in carrier gas flow rate. This is surprising since it would be expected that if the total gaseous pressure in the bubbler increased, a reduction in carrier gas flow rate would be expected to relieve the gaseous pressure.

Similarly, the invention provides control means which uses a temperature differential ($\Delta = T - T_o$), representing the comparison of the temperature (T) in the bubbler with a reference temperature ($T_o$), in a computation which surprisingly calls for an increase in carrier gas flow rate in response to a more negative differential. This also is unexpected since, for example, as the temperature falls and the differential becomes more negative it would be expected that carrier gas flow rate should be reduced to reduce the evaporative cooling effect caused by the carrier gas and consequently offset the fall in temperature.

As additional features of the invention, the flow controller provides an alarm signal, if the level of liquid in the bubbler drops below a certain minimum required to obtain adequate saturation of the carrier gas. Additionally, the alarm indicates an overpressure condition and closes the input valve to interrupt the flow of carrier gas, if an overpressure condition should occur within the bubbler. A safety relief valve is also provided to relieve the pressure within the bubbler at a predetermined pressure, for example in the case of an electronic failure.

Moreover, the apparatus of the invention is constructed from materials which are inert to the chemicals used and, in contrast to prior designs, has a high level of accuracy which can be maintained over extended periods of time, for example, at least one year, and even for years.

DETAILED DESCRIPTION OF THE PREFERRED EMBODIMENT

Figure 1:
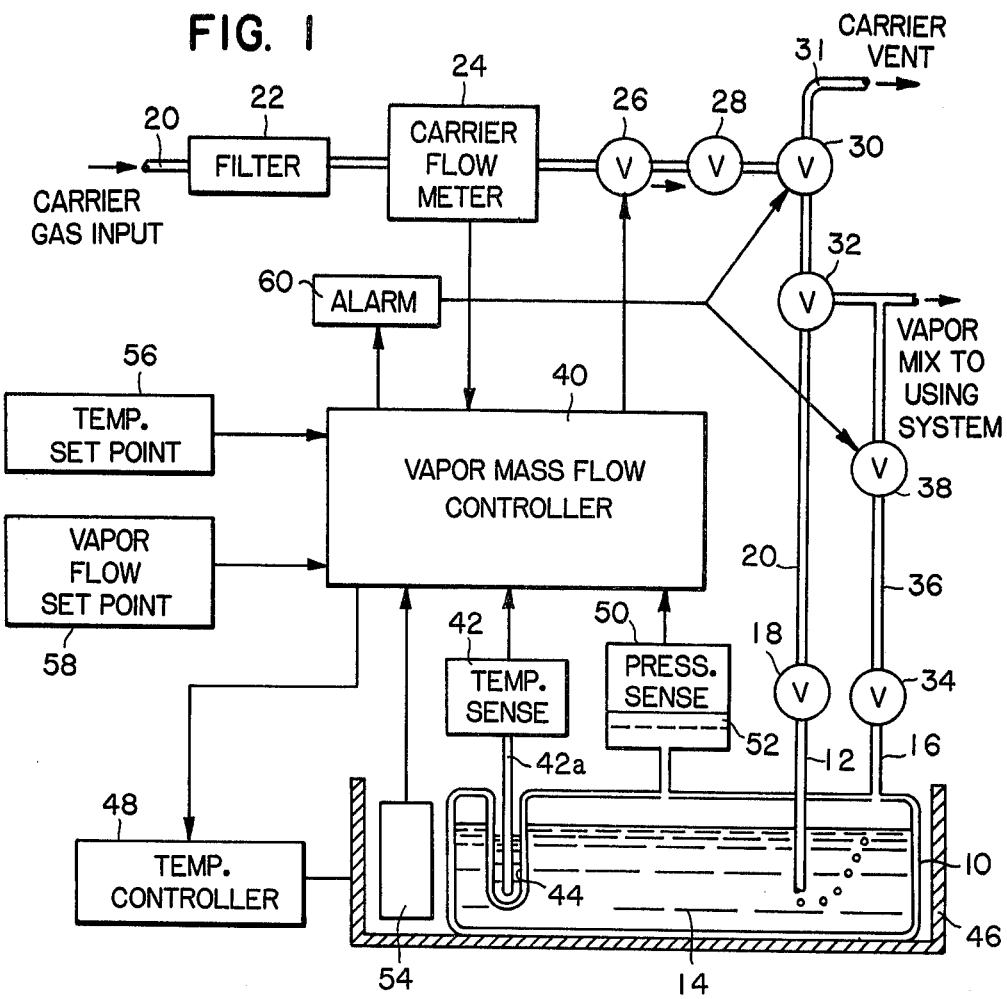
FIG. 1 is a block diagram indicating the overall arrangement and operation of the system.

Referring to FIG. 1, there is schematically illustrated a vaporizer bubbler 10 having an inlet tube 12 which enters through the upper wall of the bubbler and terminates at an open end near the bottom of the bubbler so that carrier gas exiting from the inlet tube will bubble upwardly through a quantity of liquid 14 within the bubbler container. The bubbler further has an outlet tube 16 in the upper wall of the bubbler in communication with the vapor space above the liquid in the bubbler. The bubbler is preferably made of high purity quartz material which will not react with the liquid or the carrier gas. Further details of two suitable bubblers may be obtained from U.S. Pat. Nos. 4,134,514 and 4,140,735.

The bubbler inlet tube is connected by a manually operated valve 18 to a carrier gas inlet line 20. The upper end of the inlet line is connected to a suitable carrier gas input source. Moving downstream from the carrier gas input, there is positioned a filter 22, a carrier gas flow meter 24, a carrier gas flow control valve 26, a check valve 28, a three-way vent valve 30, and a pressure relief valve 32.

The bubbler outlet tube 16 is connected by manually operated valve 34 to an outlet line 36 past a shut-off valve 38 for connection to a using system (not shown). A typical using system is a batch of semi-conductor wafers in a furnace in which the bubbler liquid vapor is to be deposited at an elevated temperature.

A vapor mass flow controller 40 receives a variety of input information and provides an output signal for controlling the flow control valve 26. One input is the temperature of the bubbler liquid 14 as measured by a temperature sensor 42 which includes a probe 42a extending into a thin-walled well 44 formed in the bubbler. The probe makes good thermal contact with the well by means of a heat transfer fluid positioned within the well.

The bubbler is positioned in a container or shell 46 for maintaining the bubbler at a desired temperature. The temperature controller 48 connected to the vapor mass flow controller 40 provides heat or extracts heat to the container 46 to monitor the bubbler at a desired level. Together, the container 46 and the controller 48 form a unit often referred to as a source-temperature controller (STC).

A pressure sensor or transducer 50 senses the pressure in the upper portion of the bubbler above the liquid and feeds a pressure input to the flow controller 40. The pressure transducer preferably includes an isolating diaphragm 52 which is exposed on one side to the bubbler interior, with the other side of the diaphragm confining a non-compressible fluid in the upper portion of the pressure sensor. The diaphragm 52 is preferably made of teflon or some other suitable material which can resist the chemicals to be confined within the bubbler, while not introducing any contamination into the source material.

A suitable sensor 54 senses the level of the liquid in the bubbler and provides a level input signal to the flow controller 40. The sensor provided information for calculating the vapor flow and for determining when the chemical supply is depleted. The level can be determined by knowing the starting level and keeping track in the mass flow controller of the total volume of vapor lost to the carrier gas stream. Another method which can be used is to sense the level by means of light emitting and detecting devices on the inner walls of the container 46.

Suitable means 56 is provided for furnishing temperature set point information to the flow controller 40. Similarly, means 58 provides a vapor flow set point value to the controller. Also, the carrier gas flow meter 24 is connected to provide carrier gas flow information to the controller. As an additional feature of the system, an alarm 60 is provided to receive a signal from the controller if certain undesired conditions should occur such as an overpressure condition in the bubbler or a lack of sufficient liquid in the bubbler. The alarm means 60 is further connected to the inlet and outlet valves 30 and 38.

Operation

In operation, the bubbler is first connected to the system as shown, the manually operated valves 18 and 34 being connected to the bubbler inlet and outlet tubes in a manner to prevent contamination with respect to the bubbler liquid. The details of one suitable manner for making connections to a bubbler are described in U.S. Pat. No. 4,134,514.

The temperature set point means 56 is adjusted to provide the desired temperature information to the controller 40. Similarly the desired vapor flow information is provided to the controller by the component 58. No pressure information need be provided by the user since the controller is preset for a standard of 760 millimeters of mercury. The temperature variation is relatively small with respect to a nominal temperature provided by the temperature set point means, and the pressure variation is also relatively small with respect to atmospheric pressure. Thus, the formula for computing the vapor mass flow, $\dot{m}$, can be simplified in the following approximate formula, which is essentially a four-dimensional linear approximation of the formula expressed above:

$\dot{m}^* = AF_c(1 + B\Delta T - C\Delta P - DF_c + E\Delta L)$ $\dot{m}^*$ = Approximate vapor mass flow $F_c$ = Carrier gas mass flow $\Delta T$ = Temperature variation from nominal $(T - T_o)$ $\Delta P$ = Pressure variation from nominal $(P - P_o)$ $\Delta L$ = Change in liquid level = $-\int \dot{m}^* dt$ and A, B and C = Positive constants computed for each chemical and nominal operating conditions;

D and E = Positive or negative constants computed for each chemical and nominal operating conditions.

Typically A is from 0.01 to 10 mg. (standard cc. )$^{-1}$; B is from 0.03 to 0.07 °C$^{-1}$; C is from $0.5 \times 10^{-3}$ to $2 \times 10^{-3}$ Torr$^{-1}$; D is $+0.1$ to $-0.1$ min (vol. of bubbler)$^{-1}$; and E is $+0.05$ to $-0.05$ (height of bubbler)$^{-1}$.

The actual values of the constants used depend upon the liquid chemical to be vaporized in the bubbles. The values are determined empirically for each chemical and bubbler design by changing $F_c$, $\Delta T$, $\Delta P$ and $\Delta L$ and using a least square fit for the data to obtain the constants.

Constant D accounts for high carrier gas flow rate producing varied vapor pick up due to, for example temperature gradients and splashing. It has been found empirically that D is sometimes negative, when vapor pick up rate increases with increasing flow, and thus the flow controller is programmed accordingly and accuracy is significantly improved.

Constant E accounts for error in uniform mass flow rate of vapor caused by lowering the level of liquid in the bubbler as liquid is vaporized by the carrier gas. The controller can be programmed to set E=0 and the apparatus arranged so that an alarm sounds when the level of liquid in the bubbler falls to a point at which errors in mass flow relating to liquid level become significant. Alternatively, it has been found empirically that E is sometimes negative and thus the controller is programmed accordingly and accuracy is significantly improved. In this situation the low level alarm may also be used.

Figure 2:
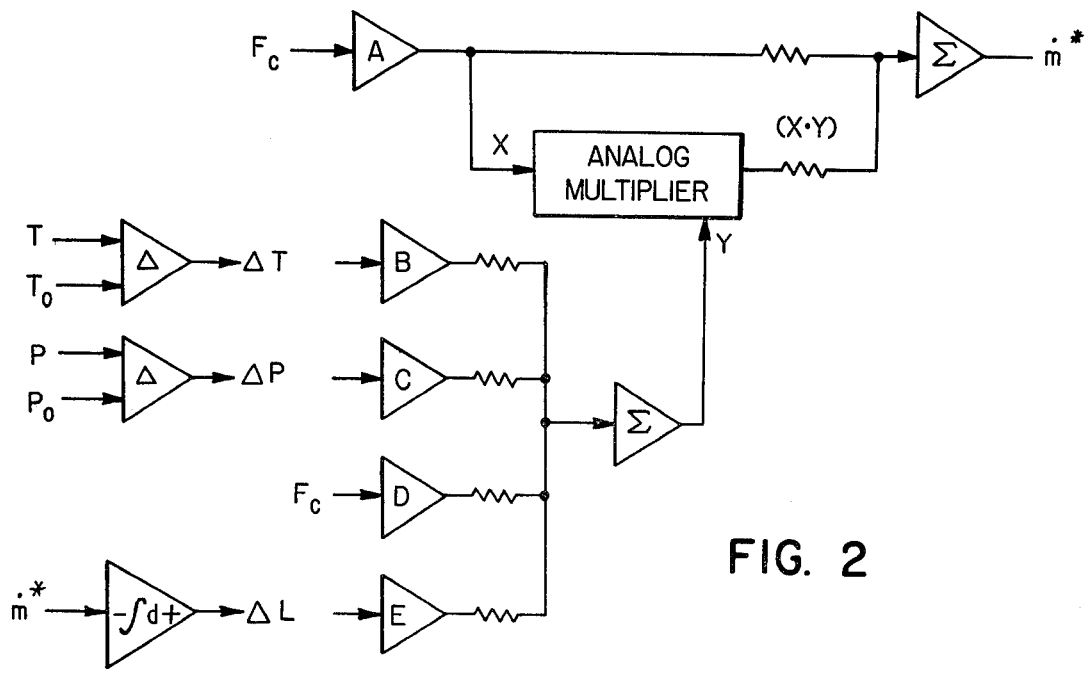
FIG. 2 is a block diagram indicating a mass flow approximation circuit of the electronic controller.

The above approximate formula can be easily implemented in the analogue or digital electronics obvious to one skilled in that art. However, to further assist in understanding the electronics required by the controller, refer to the block diagram of FIG. 2 which shows a mass flow approximation circut. As can be seen, the variables in the system are amplified and combined to produce a multiplier for combining with the carrier gas mass flow to provide the approximate vapor mass flow. The electronics for such a system can be fabricated relatively inexpensively such that the controller becomes a very practical but yet highly accurate device.

Once the initial information has been fed to the controller and the bubbler is suitably connected to the system, the carrier gas is applied to the input line 20 with the vent valve 30 in open position so that the carrier gas is vented. After a short stabilization period, the valve 38 is opened, and the vent valve 30 moved to permit carrier gas flow into the bubbler. The valves 18 and 34 have been primarily employed to facilitate installation or removal of the bubbler without loss or contamination of chemicals. The system is then in operation; and as varitions in the sensed parameters occur, the information is sent to the controller which instantly provides an output signal to the automatic flow control valve 26 to adjust the valve in a manner to maintain a uniform flow of the vaporized source material 14 transported from the bubbler by the carrier gas to the using system.

In a typical example of the system used in connection with the fabrication of semiconductors, the bubbler might contain $POCl_3$, at a total pressure of 760 mmHg. An inert carrier gas such as nitrogen is provided at a flow rate of 0 to 500 standard cubic centimeters per minute. A pressure variation $\Delta P$ is likely to be within the range of $-50$ to $+152$ mHg, with an approximate error of less than 2% in its worse case. because the bubber temperature is controlled so that its deviation is small, and the pressure deviation is similarly generally small, the nominal operating conditions are well within the approximation range of the approximate linear formula expressed above, and therefore the approximation error is much less than one percent.

If an overpressure condition is detected by the alarm means 60, the input valve 30 closes and the output valve 38 opens, if it was not already open, to eliminate the overpressure condition. If valve 38 was open, it is locked open to prevent it from being closed while the overpressure condition exists. Additional safety is afforded by the pressure relief valve 32 which vents to the vapor output to prevent bubbler explosion in case of control valve failure. The check valve 28 prevents corrosive bubbler liquid from reaching the carrier flow meter.

The foregoing system provides a reliable and practical means for maintaining the accurate vapor mass flow which is necessary in many chemical processes, particularly that used in the fabrication of semi-conductor devices and fiber optics.

What is claimed is:

1. In a chemical vapor delivery system including a container partially filled with material to be vaporized and applied to a system which uses the vapor, means for ducting a carrier gas through said material to transport said vaporized material, a valve for controlling the flow of said carrier gas to said container, and means for controlling the temperature of the material in said container, an improved method comprising:
   providing a continuous, uniform mass flow of said vaporized material to said using system by:
   sensing the total gaseous pressure (P) in said container;
   comparing said sensed pressure (P) with a reference pressure ($P_o$) to provide a pressure differential ($\Delta P = P - P_o$);
   generating a signal in a vapor mass flow controller utilizing said pressure differential ($\Delta P$) in a computation by the controller wherein, as the differential becomes more positive, said computation demands an increase in carrier gas flows; and
   transmitting said signal to said flow control valve, said signal adjusting said flow control valve to control the carrier gas flow to provide said continuous uniform mass flow of said vaporized material.

2. The method of claim 1 including the steps of:
   sensing the temperature (T) of said material to be vaporized;
   comparing said sensed temperature (T) with a nominal temperature ($T_o$) to determine a temperature differential ($\Delta T = T - T_o$);
   generating a signal in a vapor mass flow controller utilizing said temperature differential ($\Delta T$) in a computation by the controller which demands an increase in carrier gas flow in response to more negative differentials; and
   combining said temperature differential signal with said pressure differential signal to generate said signal for providing said continuous uniform mass flow of said vaporized material.

3. The method of claim 1 or 2 including:
   sensing the level of said material in said container;
   determining changes in said sensed levels;
   combining said changes in said sensed levels with said pressure differential to generate said signal for providing said continuous uniform mass flow of said vaporized material.

4. A chemical vapor delivery system comprising:
   a bubbler container for holding a quantity of high purity liquid to be vaporized and applied to a using system;

means for transporting a carrier gas through said liquid to transport the vaporized material to the using system;

means for sensing the carrier gas flow rate;

valve means for controlling the flow of said carrier gas;

means for sensing and controlling the temperature of said liquid;

means for sensing the total gaseous pressure in said container; and controller means connected to receive the sensed carrier gas flow rate, the sensed temperature and the sensed pressure and to compare the sensed pressure (P) with a reference pressure ($P_o$) to provide a pressure differential ($\Delta P = P - P_o$), said controller generating a signal in a computation wherein, as the differential ($\Delta P$) becomes more positive, said computation demands an increase in carrier gas flow rate, said signal for controlling said carrier gas flow control valve means in a manner to produce a continuous, uniform mass flow of said vaporized liquid to said using system.

5. A chemical vapor delivery system as claimed in claim 4, wherein said controller means is connected to compare said sensed temperature (T) with a reference temperature ($T_o$) to provide a temperature differential ($\Delta T = T - T_o$), said controller generating a signal in a computation wherein, as said temperature differential becomes more negative, said computation demands an increase in carrier gas flow rate.

6. A chemical vapor delivery system as claimed in claim 4 or 5 wherein, said controller means generates said signal in said computation in accordance with the approximate formula:

$$\dot{m}^* = AF_c(1 + B\Delta T - C\Delta P - DF_c + E\Delta L)$$

wherein $\dot{m}^*$ = Approximate vapor mass flow $F_c$ = Carrier gas mass flow $\Delta T$ = Temperature variation from nominal $(T - T_o)$ $\Delta P$ = Pressure variation from nominal = $(P - P_o)$ $\Delta L$ = Change in liquid level = $-\int \dot{m}^* dt$ A,B and C = Positive constants computed for each chemical and nominal operating conditions; and D and E = Positive or negative constants computed for each chemical and nominal operating conditions.

7. A chemical vapor delivery system, said delivery system for providing a continuous uniform mass flow of vapor to a using system, including:

a container partially filled with material to be vaporized and applied to said using system;

means for ducting a carrier gas through said material to transport said material in a vaporized form;

valve means for controlling the flow of said carrier gas;

means for sensing and controlling the temperature of said material in said container;

means for sensing the total gaseous pressure in said container;

means for sensing the carrier gas flow rate; and means for sensing the level of material in said container, said delivery system further including controller means for utilizing the sensed temperature, pressure, flow rate, and material level to control said valve means to provide continuous uniform vapor mass flow in accordance with the approximate formula:

$$\dot{m}^* = AF_c(1 + B\Delta T - C\Delta P - DF_c + E\Delta L)$$

wherein $\dot{m}^*$ = Approximate vapor mass flow $F_c$ = Carrier gas mass flow $\Delta T$ = Temperature variation from nominal = $(T - T_o)$ $\Delta P$ = Pressure variation from nominal = $(P - P_o)$ $\Delta L$ = Change in liquid level = $-\int \dot{m}^* dt$ A,B and C = Positive constants computed for each chemical and nominal operating conditions; and D and/or E = Negative constants computed for each chemical and nominal operating conditions.

8. An apparatus as claimed in claim 7, including means linked to said controller means for interrupting flow of carrier gas into said controller at a predetermined pressure.

9. An apparatus as claimed in claim 8, further including alarm means linked to said controller means for providing an alarm signal if the flow of carrier gas into said bubbler container is interrupted.

10. An apparatus as claimed in claim 8 including means for relieving pressure applied to said container at a predetermined pressure by venting said carrier gas to said using system.

* * * * *